(12) United States Patent
Liaw

(10) Patent No.: US 12,127,387 B2
(45) Date of Patent: Oct. 22, 2024

(54) GATE-ALL-AROUND HIGH-DENSITY AND HIGH-SPEED SRAM CELLS

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 592 days.

(21) Appl. No.: 17/389,727

(22) Filed: Jul. 30, 2021

(65) Prior Publication Data

US 2023/0032523 A1 Feb. 2, 2023

(51) Int. Cl.
| | |
|---|---|
| *H10B 10/00* | (2023.01) |
| *B82Y 10/00* | (2011.01) |
| *H01L 21/8238* | (2006.01) |
| *H01L 27/02* | (2006.01) |
| *H01L 29/06* | (2006.01) |

(Continued)

(52) U.S. Cl.
CPC ....... *H10B 10/125* (2023.02); *H01L 29/0665* (2013.01); *H01L 29/42392* (2013.01); *H01L 29/78696* (2013.01); *H10B 10/18* (2023.02)

(58) Field of Classification Search
CPC ... H10B 10/125; H10B 10/18; H01L 29/0665; H01L 29/42392; H01L 29/78696; H01L 21/823807; H01L 29/165; H01L 29/66439; H01L 29/66545; H01L 29/7848;

(Continued)

(56) References Cited

U.S. PATENT DOCUMENTS

| | | |
|---|---|---|
| 7,161,827 B2 | 1/2007 | Ramaraju et al. |
| 7,269,056 B1 | 9/2007 | Liaw |

(Continued)

OTHER PUBLICATIONS

Chen, Chun-Yuan, et al., "Semiconductor Devices with Backside Air Gap Dielectric", U.S. Appl. No. 16/888,217, filed May 29, 2020, Assignee: Taiwan Semiconductor Manufacturing Co., Ltd., 27 pages specification, 16 pages drawings.

(Continued)

*Primary Examiner* — Yara B Green
*Assistant Examiner* — Akhee Sarker-Nag
(74) *Attorney, Agent, or Firm* — HAYNES AND BOONE, LLP

(57) ABSTRACT

A semiconductor structure includes a substrate and first and second SRAM cells. The first SRAM cell includes first and second pull-up transistors, first and second pull-down transistors, and first and second pass-gate transistors. The first and the second pass-gate transistors have a first channel width. The first and the second pull-down transistors have a second channel width. A ratio of the second channel width to the first channel width is in a range of 1.05 to 1.5. The second SRAM cell includes third and fourth pull-up transistors, third and fourth pull-down transistors, and third and fourth pass-gate transistors. The third and the fourth pass-gate transistors have a third channel width. The third and the fourth pull-down transistors have a fourth channel width. The third and the fourth channel widths are substantially same. The fourth channel width is larger than the second channel width. The transistors are GAA transistors.

20 Claims, 12 Drawing Sheets

(51) Int. Cl.
  *H01L 29/10* (2006.01)
  *H01L 29/165* (2006.01)
  *H01L 29/423* (2006.01)
  *H01L 29/66* (2006.01)
  *H01L 29/775* (2006.01)
  *H01L 29/78* (2006.01)
  *H01L 29/786* (2006.01)

(58) Field of Classification Search
  CPC ............ H01L 27/0207; H01L 29/775; H01L 29/1033; H01L 29/785; B82Y 10/00
  See application file for complete search history.

(56) References Cited

U.S. PATENT DOCUMENTS

| | | |
|---|---|---|
| 8,947,902 B2 | 2/2015 | Liaw |
| 9,218,872 B1 | 12/2015 | Liaw |
| 9,257,439 B2 | 2/2016 | Liaw |
| 9,349,436 B2 | 5/2016 | Liaw |
| 10,381,070 B2 | 8/2019 | Liaw |
| 2016/0104524 A1* | 4/2016 | Liaw ................. G11C 11/412 365/51 |
| 2020/0135740 A1* | 4/2020 | Liaw ................. H01L 29/66439 |
| 2021/0020643 A1* | 1/2021 | Yang ................. H01L 29/0673 |

OTHER PUBLICATIONS

Hsu, Kuo-Hsiu et al., "Four-Poly-Pitch SRAM Cell with Backside Metal Tracks," U.S. Appl. No. 16/888,269, filed May 29, 2021, Assignee: Taiwan Semiconductor Manufacturing Co. Ltd., 27 pages specification, 17 pages drawings.

Liaw, Jhon Jhy, "Gate-All-Around Devices with Optimized Gate Spacers and Gate End Dielectrict" U.S. Appl. No. 16/899,321, filed Jun. 11, 2020, Assignee: Taiwan Semiconductor Manufacturing Co., Ltd., 36 pages specification, 33 pages drawings.

Liu, Ko-Cheng et al., "Dielectric Fins With Air Gap and Backside Self-Aligned Contact, " U.S. Appl. No. 17/118,262, filed Dec. 10, 2020, Assignee: Taiwan Semiconductor Manufacturing Co., Ltd., 39 pages specification, 32 pages drawings.

Liaw, Jhon Jhy, "Fin End Isolation Structure for Semiconductor Devices," U.S. Appl. No. 16/944,381, filed Jul. 31, 2020, Assignee: Taiwan Semiconductor Manufacturing Co., Ltd., 38 pages specification, 34 pages drawings.

\* cited by examiner

GATE-ALL-AROUND HIGH-DENSITY AND HIGH-SPEED SRAM CELLS

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One such advance is desired in embedded memory design. For example, how to provide both high-density memory cells and high-speed memory cells to meet cache memory requirements, such as L1/L2/L3 cache memories, in advanced process nodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
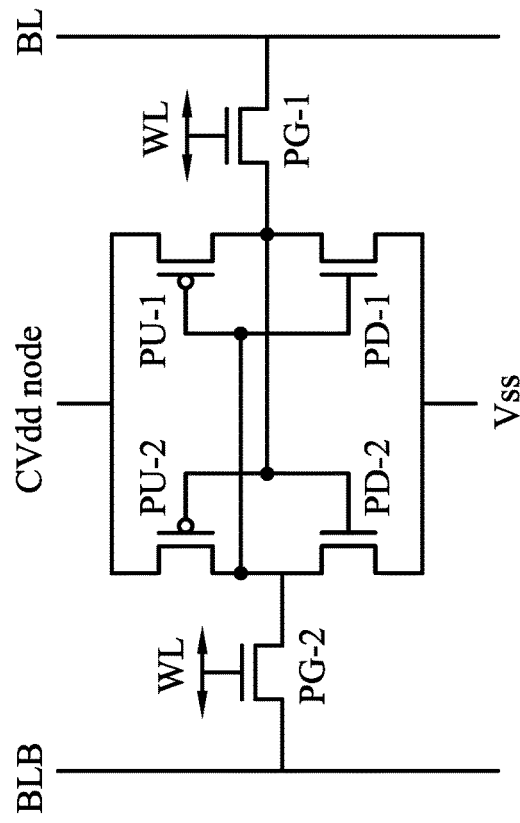
FIG. 1B shows a schematic view of a six-transistor (6T) single-port (SP) SRAM cell, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to semiconductor structures and fabrication processes thereof, and more particularly to integrated circuits (IC) having both high-density memory cells and high-speed memory cells implemented with gate-all-around (GAA) transistors (or devices). GAA devices refer to transistors having gate electrodes surrounding transistor channels, such as vertically-stacked gate-all-around horizontal nanowire or nanosheet MOSFET devices. GAA devices enable aggressive down-scaling of IC technologies, maintaining gate control and mitigating short channel effects (SCEs), while seamlessly integrating with conventional IC manufacturing processes. An objective of the present disclosure is to provide new designs and new layouts that use GAA devices to achieve both high-density memory and high-speed memory in the same device. For example, high-density GAA memory cells are provided with high beta ratio for improving noise margin during read operations and are coupled with write-assist circuitry to improve noise margin during write operations. The high beta ratio is achieved by providing wider transistor channels in pull-down (PD) GAA devices than in pass-gate (PG) GAA devices while maintaining their respective gate lengths substantially the same. Further, high-speed GAA memory cells are provided with a beta ratio of 1.0 for read/write speed improvements, where their PD and PG GAA devices have substantially the same channel widths and gate lengths. The transistor channel areas for the PD and PG GAA devices in the high-speed GAA memory cells are large. Thus, the high-speed GAA memory cells do not need write-assist circuits. To increase current capability, the PD GAA devices in the high-speed memory cells are provided with wider transistor channels than the PD GAA devices in the high-density memory cells. Also, the bit lines (and/or other conductors) for the high-speed GAA memory cells are provided with greater widths than the counterparts for the high-density GAA memory cells to further increase the operating speed of the high-speed GAA memory cells. Because the high-density GAA memory cells use a high beta ratio and a narrow channel width (relative to the high-speed GAA memory cells), their areas are reduced and their power consumption (both active and standby power consumption) are reduced. Further, the high beta ratio improves the static noise margin, thus improving the memory cells' Vcc_min performance (Vcc_min refers to the minimum operation voltage for an SRAM array to read and write safely under the required frequency constraint). Because the high-speed GAA memory cells use a beta ratio of 1 and a wide channel width (relative to the high-density GAA memory cells), their operation speed is improved and their write Vcc_min is also improved. Those of ordinary skill in the art should appreciate that they may readily use the present disclosure as a basis for designing or modifying other structures for carrying out the same purposes and/or achieving the same advantages of the embodiments introduced herein.

Figure 1A:
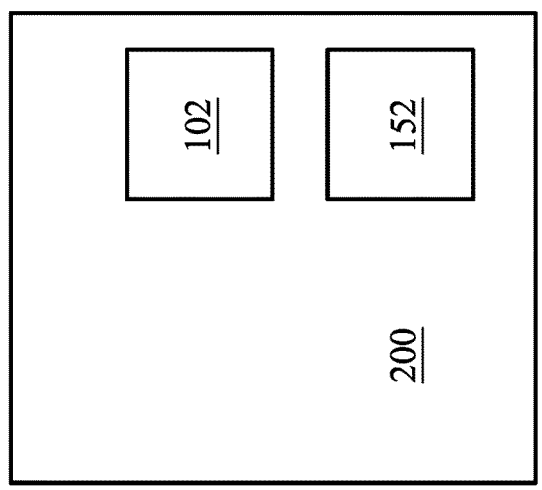
FIG. 1A is a simplified block diagram of an integrated circuit (IC) with a high-density memory macro and a high-speed memory macro, according to various aspects of the present disclosure.

FIG. 1A shows a semiconductor device 200. The semiconductor device 200 can be, e.g., a microprocessor, an application specific integrated circuit (ASIC), a field programmable gate array (FPGA), a digital signal processor (DSP), or a portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The exact functionality of the semiconductor device 200 is not a limitation to the provided subject matter.

In the present embodiment, the semiconductor device 200 includes a high-density (HD) SRAM macro 102 and a high-speed (HS) SRAM macro 152. Each of the SRAM macros 102 and 152 includes many SRAM cells that may be arranged as a memory array (or an array of memory cells), and further includes peripheral logic circuits. The memory cells store data and the peripheral logic circuits perform address decoding and read/write operations from/to the memory cells. The SRAM macro 102 further includes write-assist circuits, which will be further described later. The SRAM macro 152 does not include write-assist circuits because the memory cells therein have sufficient noise margin in both read and write operations. In the present embodiment, the SRAM macro 102 includes an array of single port (SP) six-transistor (6T) SRAM cells 104, and the SRAM macro 152 includes an array of SP 6T SRAM cells 154. The SP 6T SRAM cells 104 and the SP 6T SRAM cells 154 have the same schematic representation, which is shown in FIG. 1B, but have different layout designs and different physical structures, which will be discussed later. In various embodiments, the SRAM macros 102 and 152 may include other types of memory cells, such as dual-port memory cells or memory cells having more than six transistors.

Referring to FIG. 1B, the 6T SP SRAM cell 104 (and 154) includes two PMOS GAA transistors as pull-up transistors, PU-1 and PU-2; two NMOS GAA transistors as pull-down transistors, PD-1 and PD-2; and two NMOS GAA transistors as pass-gate (or access) transistors, PG-1 and PG-2. The PU-1 and PD-1 are coupled to form an inverter. The PU-2 and PD-2 are coupled to form another inverter. The two inverters are cross-coupled to form data storage nodes. The PG-1 and PG-2 are coupled to the data storage nodes for writing thereto and reading therefrom. FIG. 1B further shows word line (WL), bit line (BL), and bit line bar (BLB) for accessing the data storage nodes of the SRAM cell 104 (and 154), and positive power supply CVdd and negative power supply (or ground) Vss.

Figure 2:
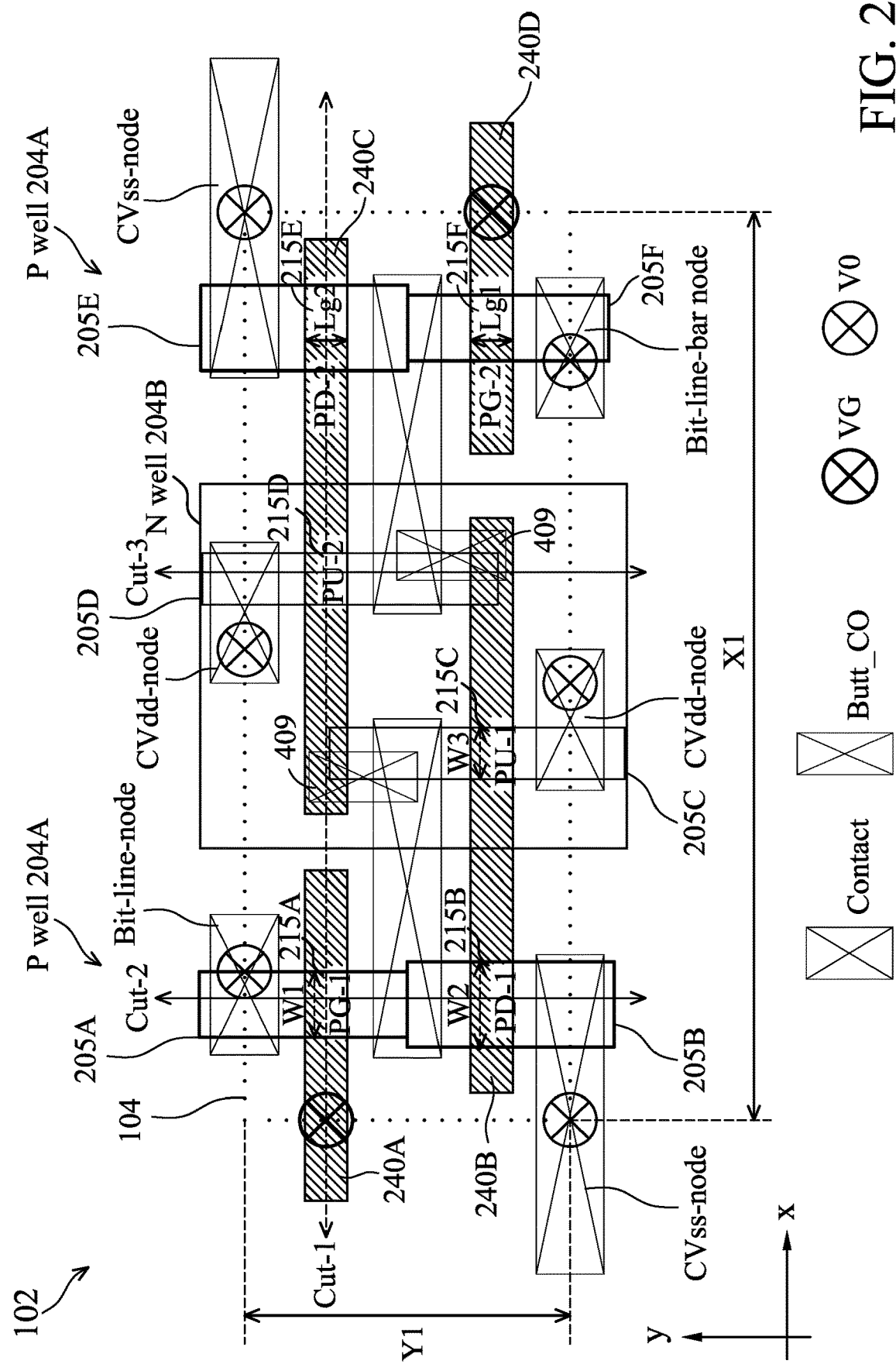
FIGS. 2 and 8 show portions of a layout of the SRAM cell of FIG. 1B, in accordance with an embodiment where the SRAM cell is a high-density memory cell.

FIG. 2 shows a layout of the SRAM macro 102, particularly, a layout of certain layers (or features) of the high-density SRAM cell 104. Referring to FIG. 2, the SRAM cell 104 occupies an area indicated by the dotted rectangular box with a length X1 along the "x" direction and a width Y1 along the "y" direction. The SRAM macro 102 includes an array of such SRAM cells 104 arranged in rows along the "x" direction and in columns along the "y" direction. In that regard, the length X1 is also the pitch of the array of memory cells 104 along the "x" direction, and the width Y1 is also the pitch of the array of memory cells 104 along the "y" direction.

The SRAM cell 104 includes active regions 205 (including 205A, 205B, 205C, 205D, 205E, and 205F) that are oriented lengthwise along the "y" direction, and gate stacks 240 (including 240A, 240B, 240C and 240D) that are oriented lengthwise along the "x" direction perpendicular to the "y" direction. The active regions 205C and 205D are disposed over an n-type well (or N Well) 204B. The active regions 205A, 205B, 205E, and 205F are disposed over p-type wells (or P Wells) 204A that are on both sides of the N well 204B along the "x" direction. The gate stacks 240 engage the channel regions of the respective active regions 205 to form transistors. In that regard, the gate stack 240A engages the channel region 215A of the active region 205A to form an NMOSFET as the pass-gate transistor PG-1; the gate stack 240B engages the channel region 215B of the active region 205B to form an NMOSFET as the pull-down transistor PD-1 and engages the channel region 215C of the active region 205C to form a PMOSFET as the pull-up transistor PU-1; the gate stack 240C engages the channel region 215E of the active region 205E to form an NMOSFET as the pull-down transistor PD-2 and engages the channel region 215D of the active region 205D to form a PMOSFET as the pull-up transistor PU-2; and the gate stack 240D engages the channel region 215F of the active region 205F to form an NMOSFET as the pass-gate transistor PG-2. The SRAM cell 104 further includes source/drain contacts disposed over the source/drain regions of the active regions 205 (the source/drain regions are disposed on both sides of the respective channel region), a butted contact (Butt_Co) 409 disposed over and connecting the active region 205C and the gate stack 240C, another butted contact 409 disposed over and connecting the active region 205D and the gate stack 240B, source/drain contact vias ("VO") disposed over and connecting to the source/drain contacts, and two gate vias ("VG") disposed over and connecting to the gate stacks 240A and 240D respectively. FIG. 2 further illustrates the circuit nodes CVss-node, CVdd-node, Bit-line-node, and Bit-line-bar-node, corresponding to the circuit nodes Vss, CVdd, BL, and BLB in FIG. 1B.

Figure 3:
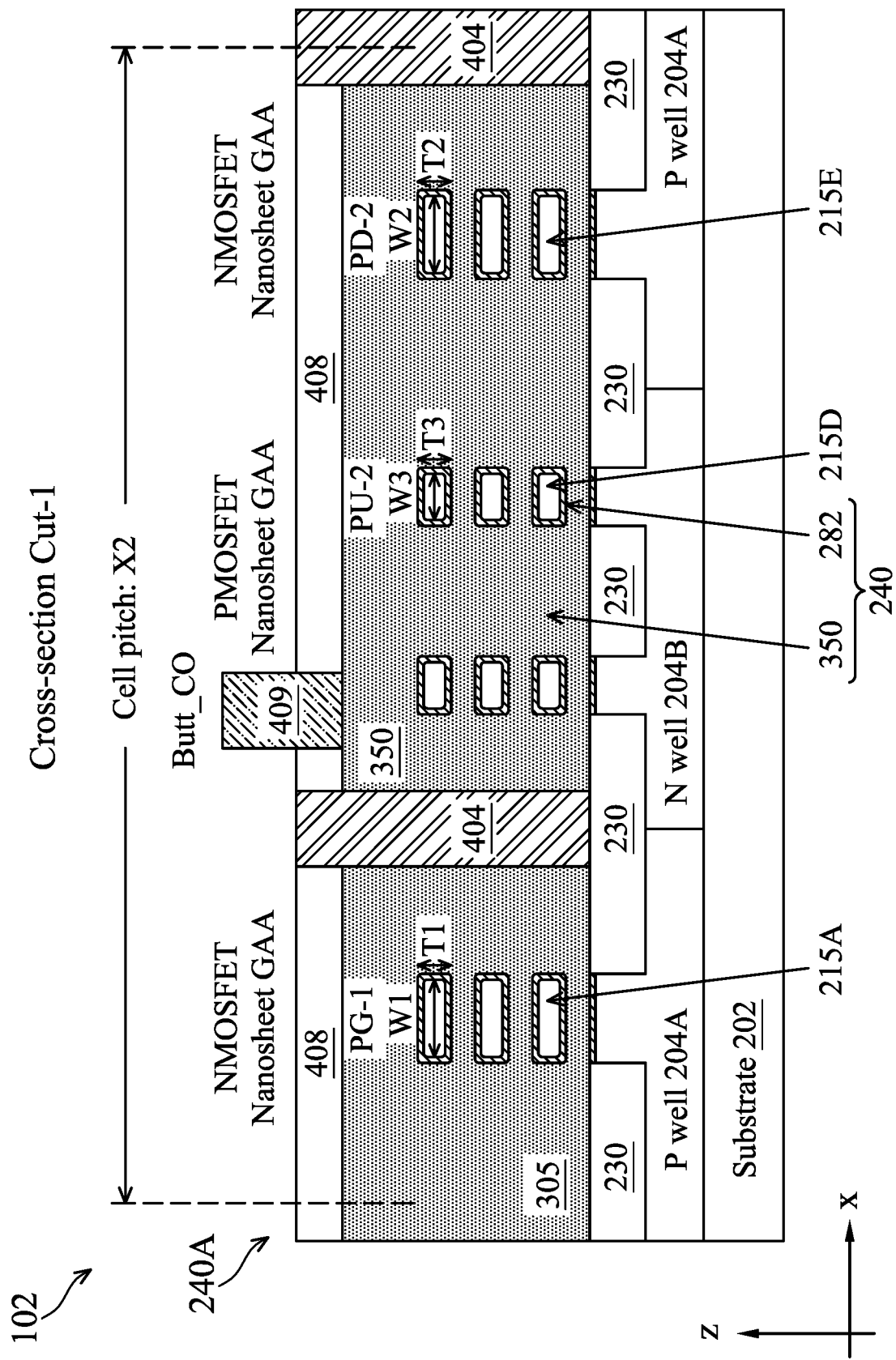
FIGS. 3, 4, and 5 show cross-sectional views of the SRAM cell of FIG. 2, in portion, along the "Cut-1" line, the "Cut-2" line, the "Cut-3" line in FIG. 2, respectively, in accordance with some embodiments of the present disclosure.
Figure 4:
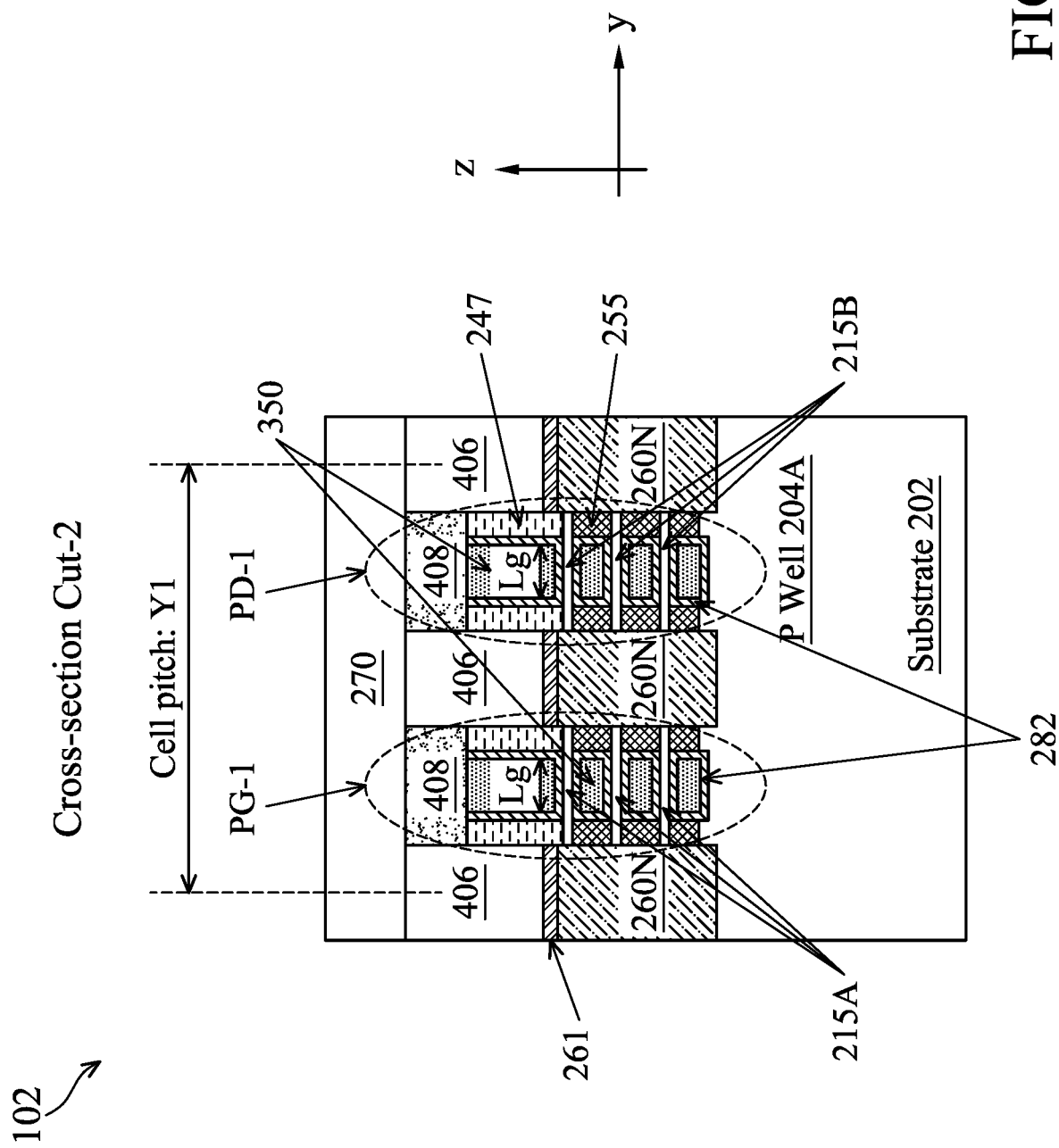
Figure 5:
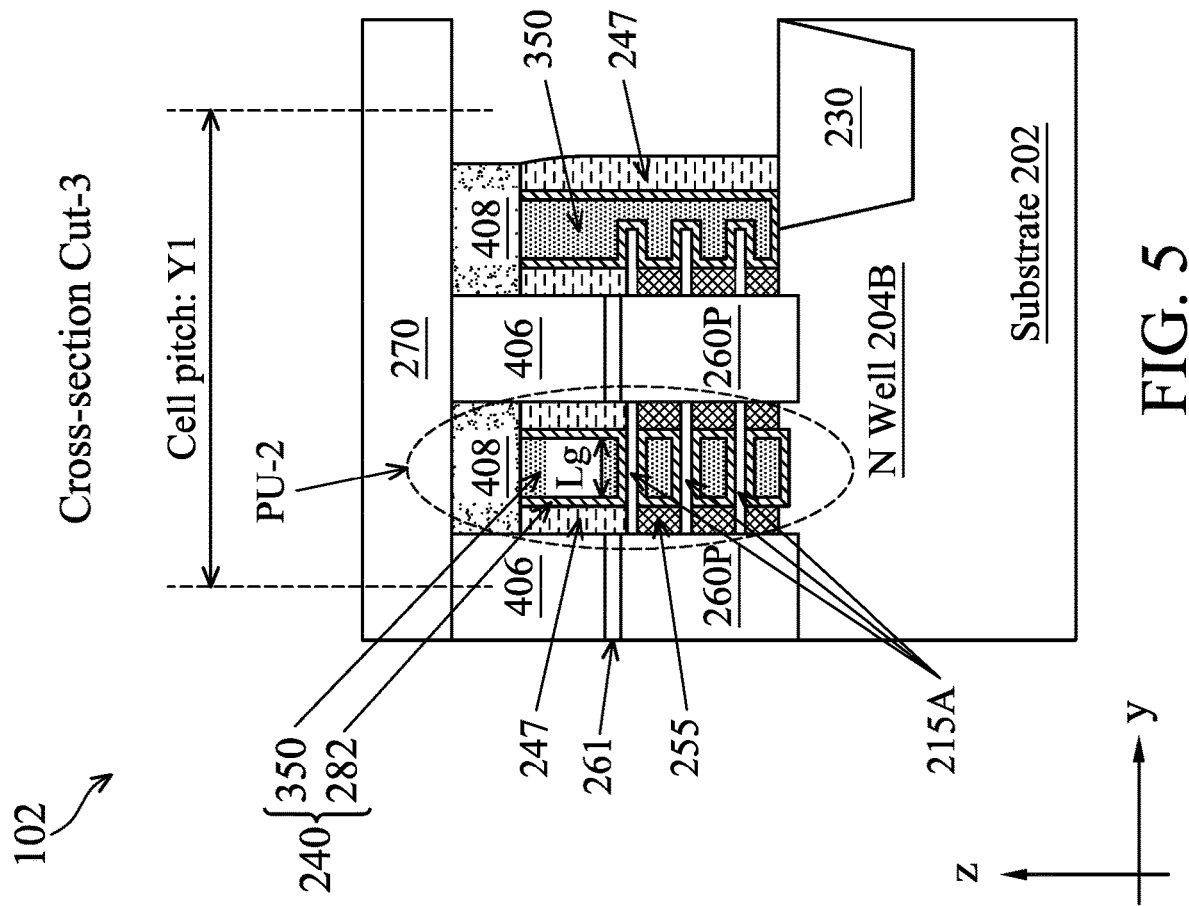

FIGS. 3, 4, and 5 illustrate cross-sectional view of the SRAM cell 104 along the "Cut-1," "Cut-2," and "Cut-3" lines in FIG. 2, respectively. Referring to FIGS. 2, 3, 4, and 5 collectively, in the present embodiment, the active regions 205 include horizontally oriented vertically stacked transistor channels 215 in the respective channel regions, and source/drain feature 260 (including 260P for PMOSFET and 260N for NMOSFET) in the source/drain regions that sandwich the channel regions. In that regards, the active regions 205A, 205B, 205C, 205D, 205E, and 205F include channels 215A, 215B, 215C, 215D, 215E, and 215F respectively. The transistor channels 215 (including 215A-F) are oriented lengthwise along the "y" direction (i.e., along a direction from source to drain), and widthwise along the "x" direction. The length of the channels 215 are also commonly referred to as gate length (or Lg). For example, FIG. 2 illustrates that the channel 215F has a gate length of Lg1 and the channel 215E has a gate length of Lg2. In the present embodiment, the gate lengths Lg1 and Lg2 are about the same, which are defined by the width of the gate stacks 240D and 240C respectively. Further, the lengths of the channels 215A, 215B, 215C, 215D, 215E, and 215F are about the same in the present embodiment. The widths of the active regions 205A through 205F, particularly the widths of the channels 215A through 215F, are designed to be different to provide performance enhancements. As shown in FIG. 2, the widths of the channels 215A and 215F (for the transistors PG-1 and PG-2 respectively) is W1, the widths of the channels 215B and 215E (for the transistors PD-1 and PD-2 respectively) is W2, and the widths of the channels 215C and 215D (for the transistors PU-1 and PU-2 respectively) is W3. In the present embodiment, the width W2 is greater than the width W1 to achieve a beta ratio greater than 1.0. For example, a ratio of W2 to W1 is in a range of 1.05 to 1.5 in some embodiments.

In a 6T SRAM cell, an alpha ratio is defined as the channel width of a PMOS pull-up transistor (such as PU-1 or PU-2) divided by the channel width of an NMOS access transistor (such as PG-1 or PG-2). A beta ratio is defined as the channel width of an NMOS pull-down transistor (such as PD-1 or PD-2) divided by the channel width of the NMOS access transistor (such as PG-1 or PG-2). The alpha and beta ratios are used to describe a SRAM cell's stability against the influences of factors such as power supply fluctuations and noise. Generally, increasing the alpha and beta ratios improves SRAM cells' stability. By designing the width W2 greater than the width W1, the SRAM cell 104 achieves a beta ratio greater than 1.0 and stable read operations. In some embodiments, such enhancement for read operations comes at the expense of lower write performance, thus a write-assist circuit is coupled to the SRAM cell 104 to improve the write performance, which will be described later. In the present embodiment, the width W1 is greater than the width W3. In various embodiments, the width W1 may be greater than or equal to the width W3.

Referring to FIG. 3, the device 200 includes a substrate 202, over which the various features including the wells 204A/B, the gate stacks 240, and the active regions 205 are formed. In an embodiment, substrate 202 includes silicon, such as a silicon wafer. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The wells 204A and 204B are formed in or on the substrate 202. In the present embodiment, the P wells 204A (and 204A' in FIGS. 6-7) are p-type doped regions configured for n-type transistors, and the N wells 204B (and 204B' in FIGS. 6-7) are n-type doped regions configured for p-type transistors. N wells 204B/B' are doped with n-type dopants, such as phosphorus, arsenic, other n-type dopant, or combinations thereof. P wells 204A/A', are doped with p-type dopants, such as boron, indium, other p-type dopant, or combinations thereof. In some implementations, substrate 202 includes doped regions formed with a combination of p-type dopants and n-type dopants. The various wells can be formed directly on and/or in substrate 202. An ion implantation process, a diffusion process, and/or other suitable doping process can be performed to form the various wells.

As shown in FIGS. 3 and 5, the device 200 further includes an isolation structure (or isolation features) 230 over the substrate 202 and isolating the adjacent active regions 205. The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIGS. 3 and 4, the channel layers 215A are suspended over the P well 204A and connecting a pair of source/drain features 260N. The channel layers 215A are stacked one over another along the "z" direction (which is the vertical direction or channel thickness direction), and each of the channel layers 215A is oriented lengthwise along the "y" direction (FIG. 4) and widthwise along the "x" direction (FIG. 3). The other channel layers 215B, 215C, 215D, 215E, and 215F are similarly configured. The gate stack 240A (including a gate dielectric layer 282 and a gate electrode 350) wraps around each of the channel layer 215A (FIG. 3), forming an NMOS gate-all-round (GAA) transistor PG-1. The other transistors PU-1, PU-2, PD-1, PD-2, and PG-2 are similarly configured as GAA transistors.

The channel layers 215 may include single crystalline silicon or intrinsic silicon. Alternatively, the channel layers 215 may comprise germanium, silicon germanium, or another suitable semiconductor material(s). Initially, the channel layers 215 are formed as part of a semiconductor layer stack that include the channel layers 215 and other semiconductor layers of a different material. During a gate replacement process, the semiconductor layer stack in the channel regions are selectively etched to remove the other semiconductor layers, leaving the channel layers 215 suspended over the substrate 202 and between the respective source/drain features 260P, 260N. This is also referred to as a channel release process.

As shown in FIG. 3, channel layers 215 for GAA PG-1 and PG-2 transistors have a width W1 along the "x" direction and a thickness "T1" along the "z" direction, channel layers 215 for GAA PD-1 and PD-2 transistors have a width W2 along the "x" direction and a thickness "T2" along the "z" direction, and channel layers 215 for GAA PU-1 and PU-2 transistors have a width W3 along the "x" direction and a thickness "T3" along the "z" direction. When the transistors are turned on, current flow through all surfaces of the respective channel layers 215. For example, the width of the effective conducting channel for a channel layer 215A is 2×W1+2×T1. Thus, the widths and the thicknesses of the channel layers 215 can be designed to achieve a particular performance target while the respective gate stack 240 can still maintain a full control of the channel layers 215 to suppress short channel effects. In the depicted embodiment, the thicknesses T1, T2, and T3 are about the same, though the present disclosure contemplates embodiments where the thicknesses T1, T2, and T3 are configured differently. Further, in the present embodiment, there are three channel layers 215 in each transistor. the present disclosure contemplates embodiments with more or less channel layers 215. For example, each transistor may have 2 to 10 channel layers 215 in some embodiments. In the present embodiment, the width W2 is designed to be greater than the width W1 to achieve a beta ratio greater than 1.0 in the SRAM cell 104. For example, a ratio of W2 to W1 is in a range of 1.05 to 1.5 in some embodiments. In various embodiments, a ratio of W1 to T1 may be in a range of 0.9 to 4, such as in a range of 1.2 to 3; and a ratio of W3 to T3 may be in a range of 1 to 2. So, the shape of the channel layers 215 is like a rectangular bar or a sheet. In some embodiments, each of the widths W1, W2, and W3 may be in the range of about 4 nm to about 60 nm.

Referring to FIG. 2, the active regions 205A and 205B interface with each other (or connect to each other). The areas of the active regions 205A and 205B between the gate stacks 240A and 240B form a shared drain region of the transistors PG-1 and PD-1. Similarly, the active regions 205E and 205F interface with each other and the areas of the active regions 205E and 205F between the gate stacks 240C and 240D form a shared drain region of the transistors PG-2 and PD-2.

Referring to FIGS. 2, 3, 4, and 5, the device 200 further includes n-type doped source/drain features 260N and p-type doped source/drain features 260P in the source/drain regions (including the shared drain regions discussed above). For example, source/drain features 260N are disposed over both sides of the gate stack 240A and connected by the channel layers 215A to form NMOS GAA transistor PG-1. Similarly, source/drain features 260N are disposed over both sides of the gate stack 240B, 240C, and 240D and connected by the channel layers 215B, 215E, and 215F to form NMOS GAA transistor PD-1, PD-2, and PG-2, respectively. Source/drain features 260P are disposed over both sides of the gate stack 240B and 240C and connected by the channel layers 215C and 215D to form PMOS GAA transistor PU-1 and PU-2, respectively.

The source/drain features 260P and 260N may be formed using epitaxial growth. For example, a semiconductor material is epitaxially grown from portions of substrate 202 and the channel layers 215, forming epitaxial source/drain features 260P and 260N. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or the channel layers 215. In some embodiments, the epitaxial source/drain features 260N may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). In some embodiments, epitaxial source/drain features 260P and/or 260N include more than one epitaxial semiconductor layer, where the epitaxial semiconductor layers can include the same or different materials and/or dopant concentrations. In some embodiments, epitaxial source/drain features 260P and 260N include materials and/or dopants that achieve desired tensile stress and/or compressive stress in respective channel regions of the transistors. In some embodiments, epitaxial source/drain features 260P and 260N are doped during deposition by adding impurities to a source material of the epitaxy process (i.e., in-situ). In some embodiments, epitaxial source/drain features 260P and 260N are doped by an ion implantation process subsequent to a deposition process. In some embodiments, annealing processes (e.g., rapid thermal annealing (RTA) and/or laser annealing) are performed to activate dopants in epitaxial source/drain features 260P and 260N and/or other source/drain regions (for example, heavily doped source/drain regions and/or lightly doped source/drain (LDD) regions). In some embodiments, epitaxial source/drain features 260P and 260N are formed in separate processing sequences that include, for example, masking p-type transistor regions when forming epitaxial source/drain features 260N in n-type transistor regions and masking n-type transistor regions when forming epitaxial source/drain features 260P in p-type transistor regions.

As shown in FIGS. 3, 4, and 5, each gate stack 240 includes a gate electrode layer 350 disposed over a gate dielectric layer 282. The gate electrode layer 350 and the gate dielectric layer 282 wrap around each of the channel layers 215. In some further embodiments, the gate stack 240 further includes an interfacial layer (such as having silicon dioxide, silicon oxynitride, or other suitable materials) between the gate dielectric layer 282 and the channel layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods. In some embodiments, the gate electrode layer 350 includes an n-type work function layer for NMOSFET device or a p-type work function layer for PMOSFET device and further includes a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

As shown in FIG. 4, the device 200 includes gate spacers 247 on sidewalls of the gate stacks 240 and over the channel layers 215. The gate spacers 247 are formed by any suitable process and include a dielectric material such as silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, air gap, or a combination thereof. For example, a dielectric layer including silicon and nitrogen, such as a silicon nitride layer, can be deposited over the gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stacks 240. In such implementations, the various sets of spacers can include materials having different etch rates. For example, a first dielectric layer including silicon and oxygen (e.g., silicon oxide) can be deposited and etched to form a first spacer set adjacent to the gate stacks 240, and a second dielectric layer including silicon and nitrogen (e.g., silicon nitride) can be deposited and etched to form a second spacer set adjacent to the first spacer set.

As shown in FIG. 4, the device 200 further includes gate spacers 255 on sidewalls of the gate stack 240 and below the topmost channel layer 215. In the present disclosure, the gate spacers 247 are also referred to as outer spacers 247 or top spacers 247, and the gate spacers 255 are also referred to as inner spacers 255. The inner spacers 255 are disposed laterally between the source/drain features 260N (or 260P) and the gate stacks 240 and vertically between adjacent channel layers 215. In various embodiments, the top spacers 247 may have a width along the "y" direction in a range of about 3 nm to about 12 nm, and the inner spacers 255 may have a width along the "y" direction in a range of about 3 nm to about 12 nm.

As shown in FIG. 3, the device 200 further includes gate-end dielectric features 404 that are disposed between an end of a gate stack 240 and an end of another gate stack 240. The top spacers 247, inner spacers 255, and gate-end dielectric features 404 provide isolation functions—isolating the gate stacks 240 from each other and from nearby conductors including source/drain features 260N and 260P and source/drain contacts 406 (see FIG. 4 for an example). In an embodiment, the materials for the top spacers 247, inner spacers 255, and gate-end dielectric features 404 are different from each other and the gate-end dielectric features 404 have the highest dielectric constant among the three. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, $BaZrO$, $BaTiO_3$ (BTO), (Ba, Sr)$TiO_3$ (BST), hafnium dioxide-alumina ($HfO_2$—$Al_2O_3$) alloy, other suitable high-k dielectric material, or combinations thereof. In a further embodiment, the inner spacers 255 have a higher effective dielectric constant than the top spacers 247. For example, the inner spacers 255 may include a material selected from a group consisting of $SiO_2$, $Si_3N_4$, SiON, SiOC, SiOCN, nitride base dielectric material, air gap, or a combination thereof; and the top spacers 247 may include a material selected from a group consisting of $SiO_2$, $Si_3N_4$, carbon doped oxide, nitrogen doped oxide, porous oxide, air gap, or a combination thereof.

As shown in FIGS. 3, 4, and 5, the device 200 further includes a gate-top dielectric layer 408 that is disposed over each of the gate stacks 240. In an embodiment, the thickness of the gate-top dielectric layer 408 is in a range of about 2 nm to about 60 nm. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. The gate-top dielectric layer 408 may be formed by recessing the gate stacks 240 and the gate spacers 247 to form trenches, fill the trenches with one or more dielectric materials, and performing a CMP process to remove excessive dielectric materials.

As shown in FIGS. 4 and 5, the device 200 further includes silicide features 261 over the source/drain features 260N and 260P, and source/drain contacts 406 over the silicide features 261. The silicide features 261 may be formed by depositing one or more metals over the S/D features 260N/P, performing an annealing process to the device 200 to cause reaction between the one or more metals and the S/D features 260N/P to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

As shown in FIGS. 4 and 5, the device 200 further includes an inter-layer dielectric (ILD) layer 270. The ILD layer 270 is disposed over the isolation structure 230, the S/D features 260N/P, the S/D contacts 406, the gate stacks 240, the gate spacers 247, and the gate-top dielectric layer 408. In some embodiments, the device 200 further includes a contact etch stop layer (CESL) between the ILD layer 270 and the S/D features 260N/P, the gate stacks 240, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

As shown in FIGS. 2 and 3, the device 200 further includes butted contacts 409 that electrically connect the S/D contacts 406 to the respective gate stack 240C and 240B and various gate vias "VG" and source/drain contact vias "VO." Each of the gate vias, S/D contact vias, and butted contacts may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

Figure 6:
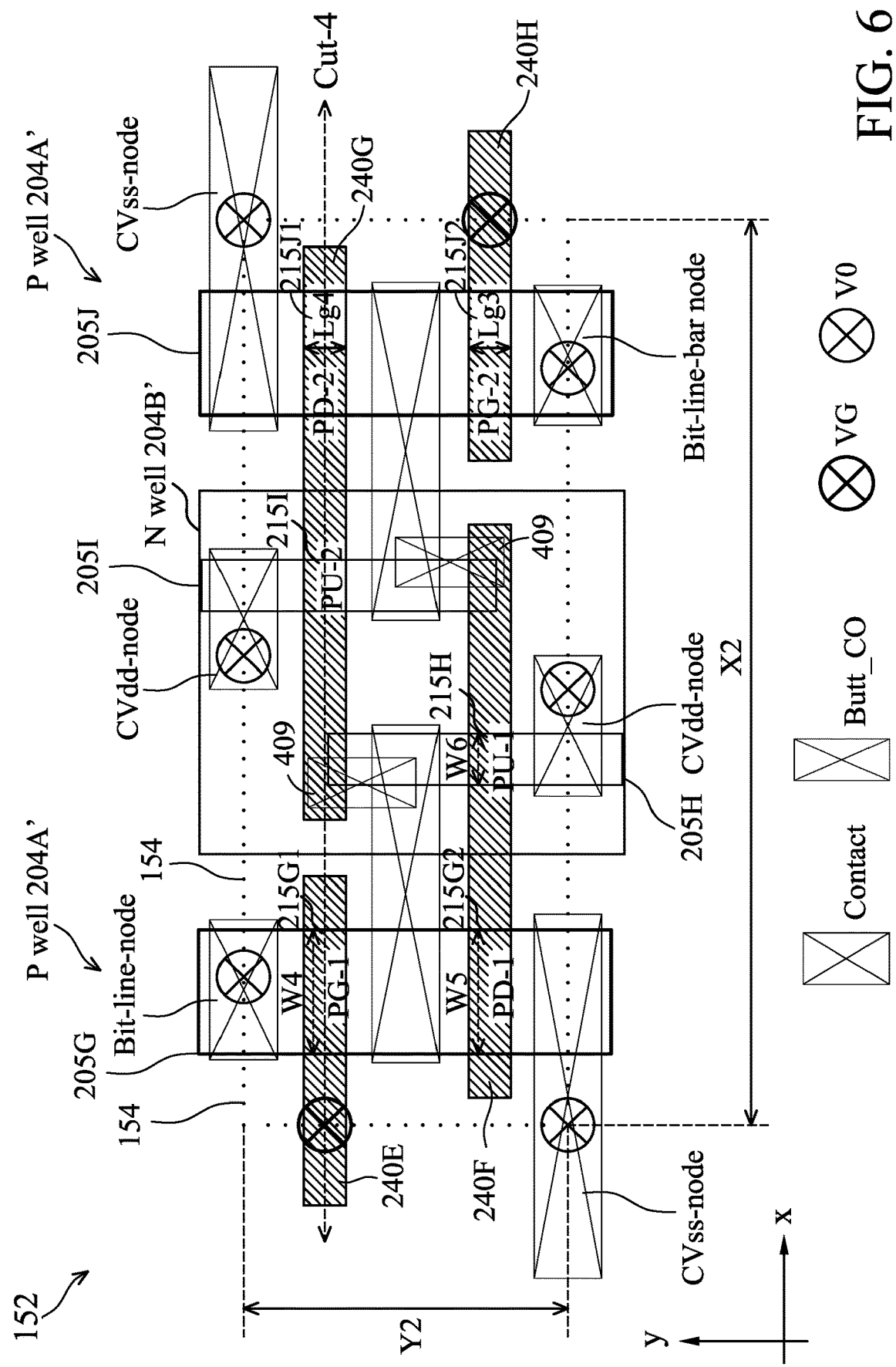
FIGS. 6 and 9 show portions of a layout of the SRAM cell of FIG. 1B, in accordance with another embodiment where the SRAM cell is a high-speed memory cell.

FIG. 6 shows a layout of the SRAM macro 152, particularly, a layout of certain layers (or features) of the high-current SRAM cell 154. Referring to FIG. 6, the SRAM cell 154 occupies an area indicated by the dotted rectangular box with a length X2 along the "x" direction and a width Y2 along the "y" direction. The SRAM macro 152 includes an array of such SRAM cells 154 arranged in rows along the "x" direction and in columns along the "y" direction. In that regard, the length X2 is also the pitch of the array of memory cells 154 along the "x" direction, and the width Y2 is also the pitch of the array of memory cells 154 along the "y" direction. In the present embodiment, the area occupied by the high-current SRAM cell 154 is greater than the area occupied by the high-density SRAM cell 104 (see FIG. 2), providing a higher performance (e.g., a higher driving current) than the SRAM cell 104. In an embodiment, a ratio of X2 to X1 is greater than 1.05, such as in a range of 1.05 to 1.5, and the dimensions Y1 and Y2 are substantially the same (for example, the SRAM cells 104 and 154 may be laid out in a same row to simplify layout). In an embodiment, each of the SRAM cells 104 and 154 is designed to be a thin slice to simplify the layout. For example, a ratio of X1 to Y1 may be greater than 2, such as in a range of 2 to 2.5, and a ratio of X2 to Y2 may be greater than 2.5, such as in a range of 2.5 to 3.5.

The SRAM cell 154 includes active regions 205 (including 205G, 205H, 205I, and 205J) that are oriented lengthwise along the "y" direction, and gate stacks 240 (including 240E, 240F, 240G and 240H) that are oriented lengthwise along the "x" direction perpendicular to the "y" direction. The active regions 205H and 205I are disposed over an N Well 204B'. The active regions 205G and 205J are disposed over P Wells 204A' that are on both sides of the N well 204B' along the "x" direction. The gate stacks 240 engage the channel regions of the respective active regions 205 to form transistors. In that regard, the gate stack 240E engages the channel region 215G1 of the active region 205G to form an NMOSFET as the pass-gate transistor PG-1; the gate stack 240F engages the channel region 215G2 of the active region 205G to form an NMOSFET as the pull-down transistor PD-1 and engages the channel region 215H of the active region 205H to form a PMOSFET as the pull-up transistor PU-1; the gate stack 240G engages the channel region 215J1 of the active region 205J to form an NMOSFET as the pull-down transistor PD-2 and engages the channel region 215I of the active region 205I to form a PMOSFET as the pull-up transistor PU-2; and the gate stack 240H engages the channel region 215J2 of the active region 205J to form an NMOSFET as the pass-gate transistor PG-2. The SRAM cell 154 further includes source/drain contacts disposed over the source/drain regions of the active regions 205 (the source/drain regions are disposed on both sides of the respective channel regions), butted contacts (Butt_Co) 409 disposed over and connecting the active region 205H to the gate stack 240G and connecting the active region 205I to the gate stack 240F, source/drain contact vias ("VO") disposed over and connecting to the source/drain contacts, and two gate vias ("VG") disposed over and connecting to the gate stacks 240E and 240H respectively. FIG. 6 further illustrates the circuit nodes CVss-node, CVdd-node, Bit-line-node, and Bit-line-bar-node, corresponding to the circuit nodes Vss, CVdd, BL, and BLB in FIG. 1B.

Figure 7:
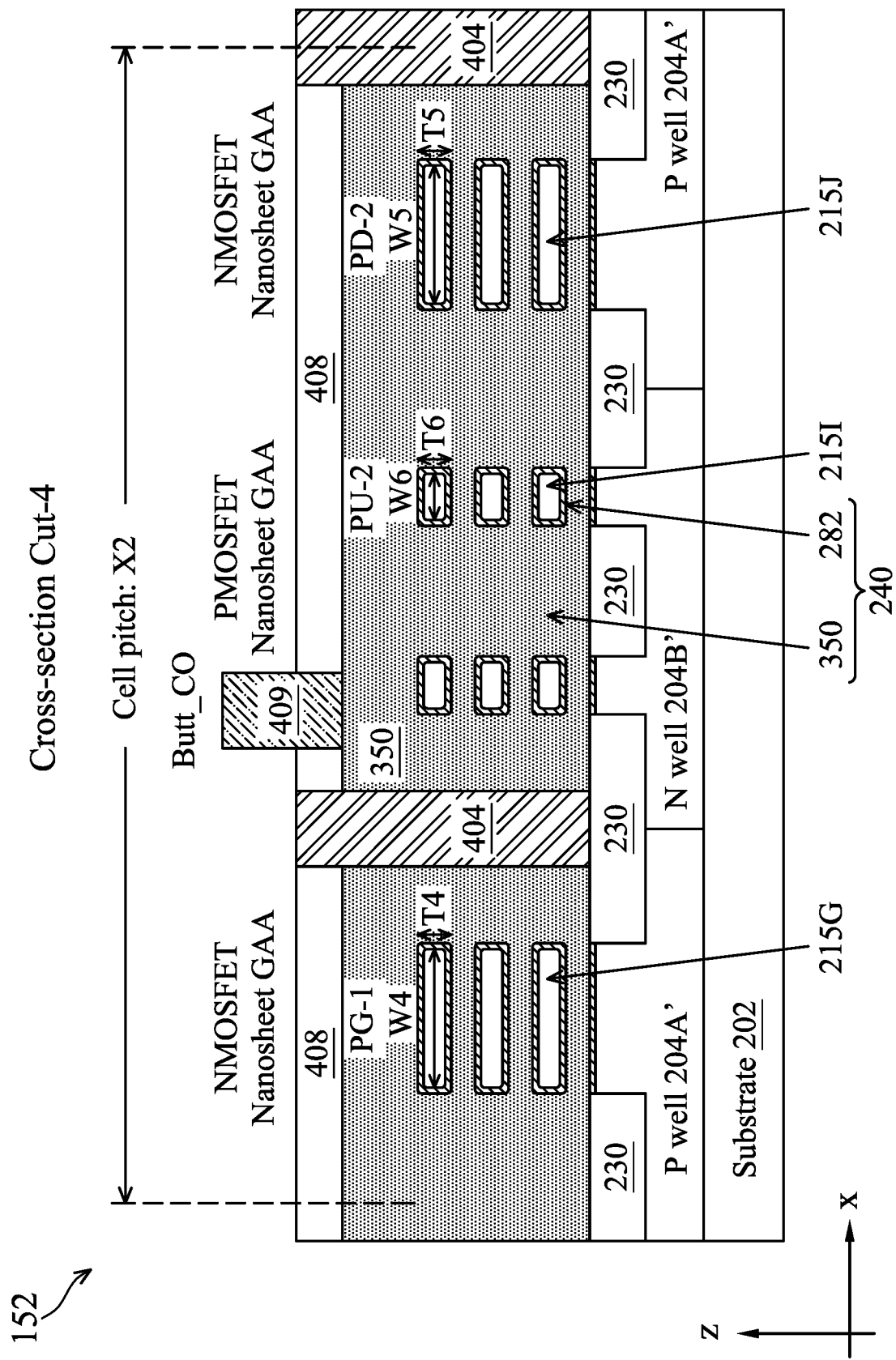
FIG. 7 shows a cross-sectional view of the SRAM cell of FIG. 6, in portion, along the "Cut-4" line in FIG. 6, in accordance with different embodiments of the present disclosure.

FIG. 7 illustrates a cross-sectional view of the SRAM cell 154 along the "Cut-4" line in FIG. 6. Various features of the SRAM cell 154 are the same as or similar to those of the SRAM cell 104, with like reference numerals denoting like features. Referring to FIGS. 6 and 7 collectively, in the present embodiment, the active regions 205 include horizontally oriented vertically stacked transistor channels 215 in the respective channel regions, and source/drain feature 260 (including 260P for PMOSFET and 260N for NMOSFET) in the source/drain regions that sandwich the channel regions. In that regards, the active regions 205G, 205H, 205I, and 205J include channels 215G1, 215G2, 215H, 215I, 215J1, and 215J2 respectively. The transistor channels 215 are oriented lengthwise along the "y" direction (i.e., along a direction from source to drain or vice versa), and widthwise along the "x" direction. The channel 215J2 has a gate length of Lg3, while the channel 215J1 has a gate length of Lg4. In the present embodiment, the gate lengths Lg3 and Lg4 are about the same, which are defined by the width of the gate stacks 240H and 240G respectively. Further, the lengths of the channels 215G1, 215G2, 215H, 215I, 215J1, and 215J2 are about the same in the present embodiment, and they are about the same as the lengths of the channels 215A, 215B, 215C, 215D, 215E, and 215F in the high-density SRAM memory cell 104.

As shown in FIG. 6, the widths of the channels 215G1 and 215J2 (for the transistors PG-1 and PG-2 respectively) is W4, the widths of the channels 215G2 and 215J1 (for the transistors PD-1 and PD-2 respectively) is W5, and the widths of the channels 215H and 215I (for the transistors PU-1 and PU-2 respectively) is W6. In the present embodiment, the width W4 is about the same as the width W5 to achieve a beta ratio of 1.0 for the SRAM cell 154. Further, the width W5 is greater than the width W2 (FIG. 2). In other words, the NMOS GAA transistors PG-1, PG-2, PD-1, and PD-2 in the high-current SRAM cell 154 have wider channels than their counterparts in the high-density SRAM cell 104. For example, a ratio of W5 to W2 may be in a range of 1.2 to 5, such as in a range of 1.3 to 3, in some embodiments. This increases the current conducting capability in the high-current SRAM cell 154 relative to the high-density SRAM cell 104. Conversely, this reduces the area and power consumption of the high-density SRAM cell 104 relative to the high-current SRAM cell 154. Thus, the high-current SRAM cell 154 are provided with robust read/write operations and a low Vcc_min for write operations even though its beta ratio is lower than that of the high-density SRAM cell 104. This is because a device's Vt mismatch value (the lower, the better) is proportional to $1/\sqrt{WL}$. Thus, a larger width W leads to a lower Vt mismatch and benefits the cell's Vcc_min performance. In an embodiment, a ratio of W6 to W4 (the alpha ratio of the high-current SRAM cell 154) is less than about 0.7. For example, a ratio of W4 to W6 may be in a range of 1.5 to 5 for write margin improvements. In some embodiments, the widths W6 and W3 are about the same. In some alternative embodiments, the width W6 is greater than the width W3. For example, a ratio of W6 to W3 may be in a range of 1.05 to 1.5 in some embodiments.

As shown in FIG. 7, in the SRAM macro 152, channel layers 215 for GAA PG-1 and PG-2 transistors have a width W4 along the "x" direction and a thickness "T4" along the "z" direction, channel layers 215 for GAA PD-1 and PD-2 transistors have a width W5 along the "x" direction and a thickness "T5" along the "z" direction, and channel layers 215 for GAA PU-1 and PU-2 transistors have a width W6 along the "x" direction and a thickness "T6" along the "z" direction. When the transistors are turned on, current flow through all surfaces of the respective channel layers 215. For example, the width of the effective conducting channel for a channel layer 215G is 2×W4+2×T4. Thus, the widths and the thicknesses of the channel layers 215 can be designed to achieve a particular performance target while the respective gate stack 240 can still maintain a full control of the channel layers 215 to suppress short channel effects. In the depicted embodiment, the thicknesses T4, T5, and T6 are about the same, though the present disclosure contemplates embodiments where the thicknesses T4, T5, and T6 are configured differently. Further, the thicknesses T4, T5, and T6 may be designed to the same as or different from the thicknesses T1, T2, and T3. Still further, in the present embodiment, there are three channel layers 215 in each transistor in the SRAM cell 154. The present disclosure contemplates embodiments with more or less channel layers 215. For example, each transistor may have 2 to 10 channel layers 215 in some embodiments. In various embodiments, a ratio of W4 to T4 may be in a range of 3 to 10, a ratio of W5 to T5 may be in a range of 3 to 10, and a ratio of W6 to T6 may be in a range of 1 to 2. In some embodiments, each of the widths W4, W5, and W6 may be in the range of about 4 nm to about 60 nm.

Figure 8:
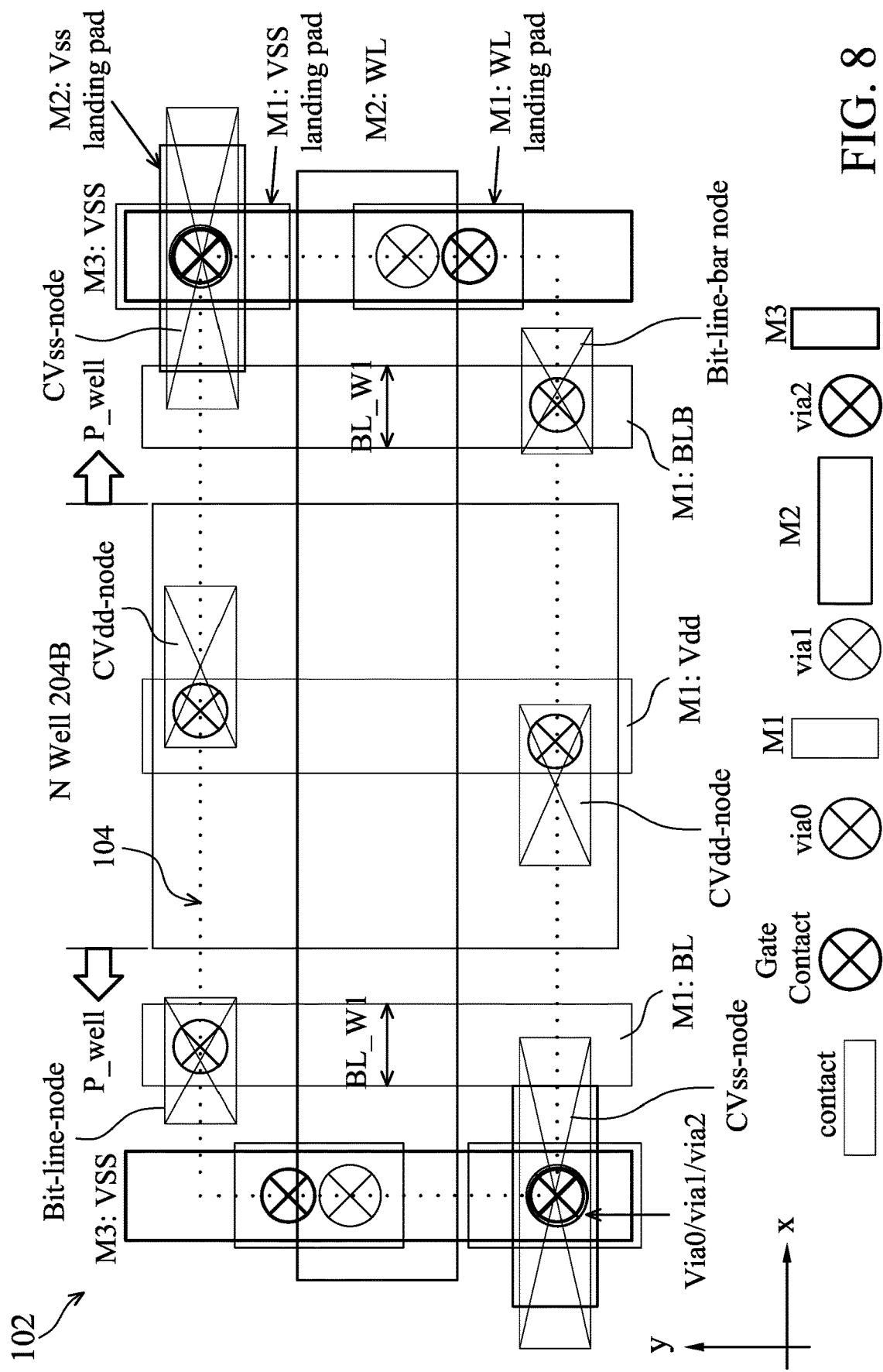

FIG. 8 shows a layout of certain metal layers of the high-density SRAM cell 104. For simplicity, the active regions 205 and the gate stacks 240 are omitted, while the dotted box representing the SRAM cell 104 is still shown in FIG. 8. Referring to FIG. 8, the bit lines BL and BLB and the positive power supply line Vdd (or CVdd) are implemented as conductors (metal lines) in the first metal layer M1 and are connected to the underlying source/drain contacts through vias ("via0"). These conductors in the M1 layer are oriented lengthwise along the "y" direction. The word line WL and Vss landing pads are implemented as conductors (metal lines) in the second metal layer M2 immediately above the M1 layer and are connected to the underlying features in the M1 layer (such as a Vss landing pad and a WL landing pad) through vias ("via1"). These conductors in the M2 layer are oriented lengthwise along the "x" direction. The negative power supply line or ground Vss are implemented as conductors (metal lines) in the third metal layer M3 immediately above the M2 layer, which are oriented lengthwise along the "y" direction and are connected to the underlying features in the M2 layer (such as a Vss landing pad) through vias ("via2"). As shown in FIG. 8, the bit line (BL and BLB) conductors in the M1 layer have a width BL_W1 along the "x" direction.

Figure 9:
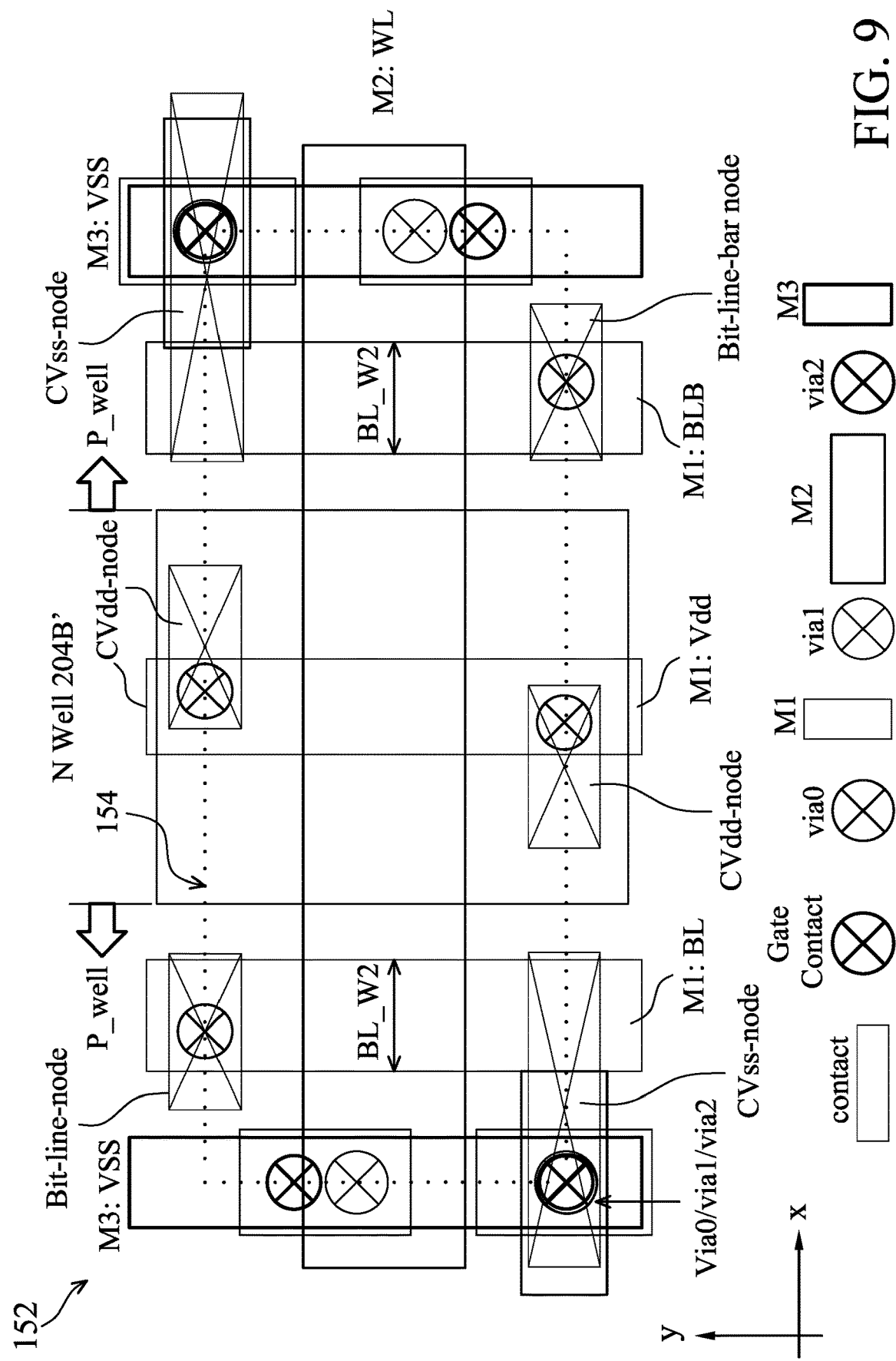

FIG. 9 shows a layout of certain metal layers of the high-current SRAM cell 154. These metal layers are structurally similar to their counterparts in the high-density SRAM cell 104. For example, the bit line conductors (BL and BLB) and the positive power supply line Vdd are implemented as conductors (metal lines) in the first metal layer M1; the word line WL and Vss landing pads are implemented as conductors (metal lines) in the second metal layer M2; and the negative power supply line or ground Vss are implemented as conductors (metal lines) in the third metal layer M3. As shown in FIG. 9, the bit line (BL and BLB) conductors in the M1 layer have a width BL_W2 along the "x" direction. In the present embodiment, the bit line conductors of the high-current SRAM cell 154 are wider than the bit line conductors of the high-density SRAM cell 104 (i.e., BL_W2>BL_W1) so that higher current can be conducted through the bit line conductors in the high-current SRAM cell 154 while reducing voltage drop during read and write operations. For example, a ratio of BL_W2 to BL_W1 may be greater than 1.2, such as in a range of 1.2 to 2 in some embodiments.

As discussed above, the high-density SRAM cell 104 is designed to have a high beta ratio to improve read margin and to reduce power consumption. However, this comes at the expense of write margin. In the present embodiment, a write-assist circuit (provided in the SRAM macro 102) is coupled to the SRAM cell 104 to improve the write margin thereof. For the high-current SRAM cell 154, its pull-down transistors and pass-gate transistors have wide channels. Thus, it does not need a write-assist circuit, and the SRAM macro 150 does not include a write-assist circuit.

Figure 10A:
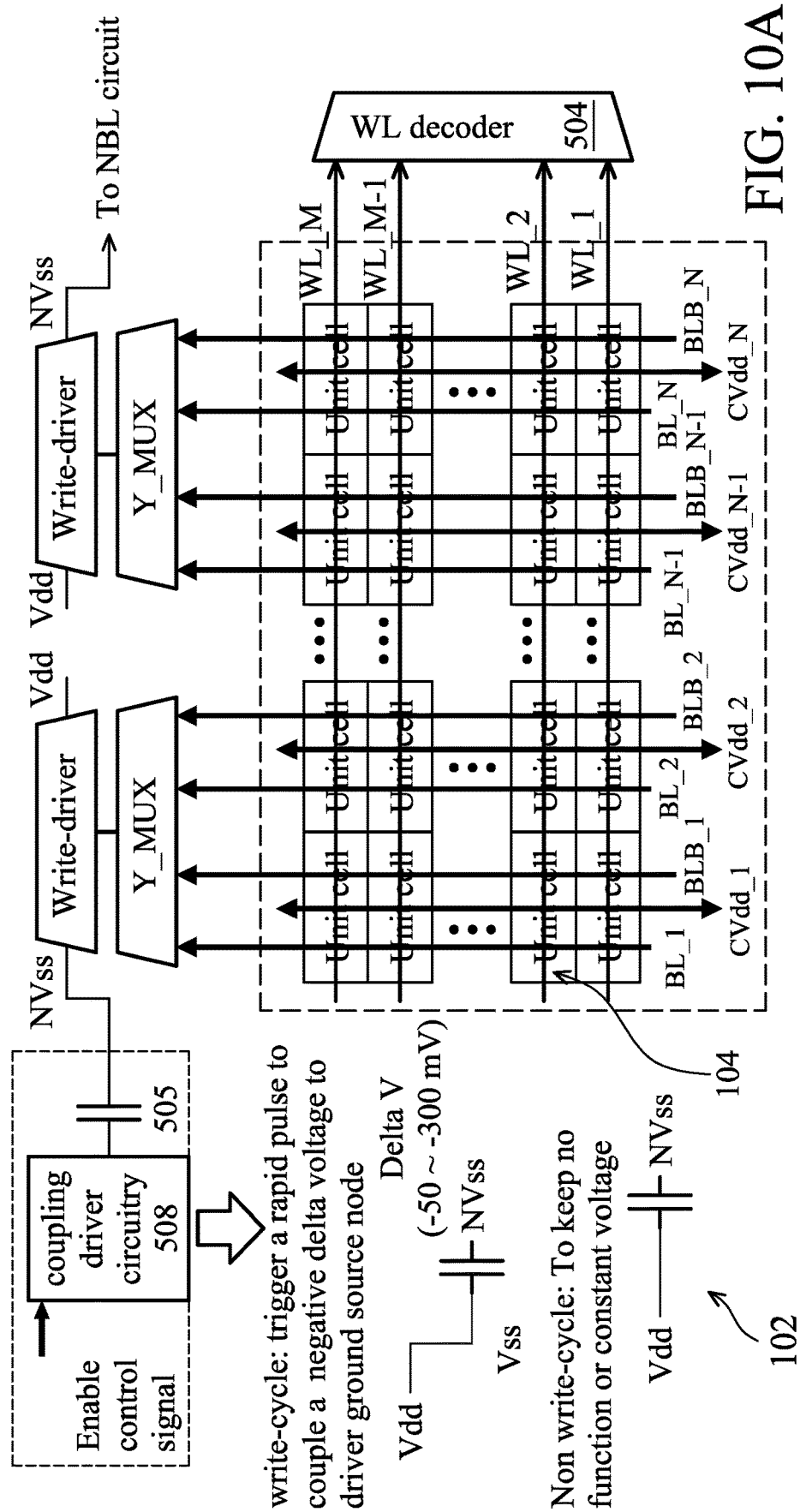
FIGS. 10A and 10B illustrate a write-assist circuit coupled to high-density memory cells such as those shown in FIG. 2, in accordance with an embodiment of the present disclosure.
Figure 10B:
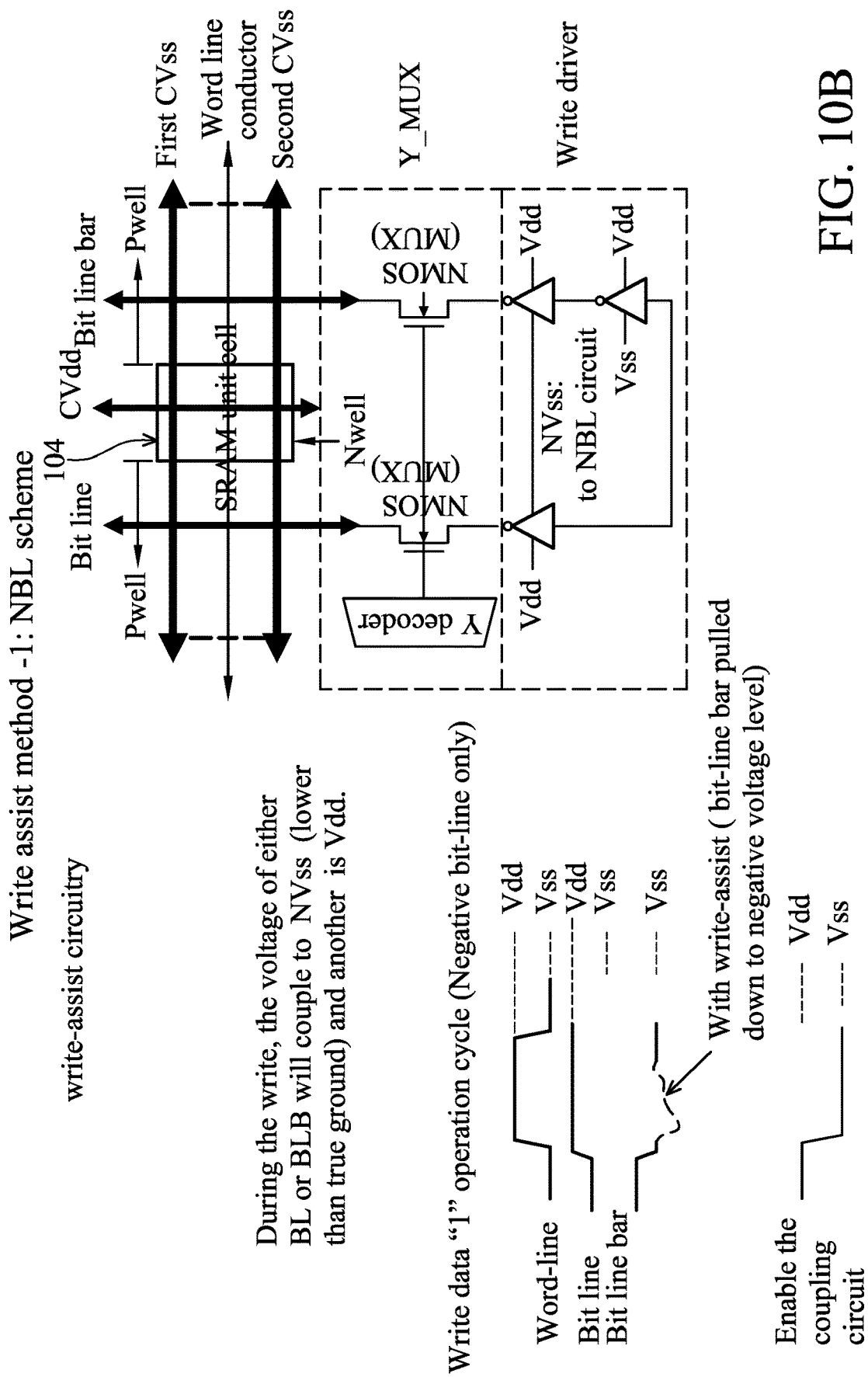

FIGS. 10A and 10B illustrate an embodiment of the write-assist circuit implemented in the SRAM macro 102, particularly, in the peripheral logic circuit of the SRAM macro 102. As shown in FIG. 10A, an array of memory cells 104 are provided (in the dashed box) and are labeled as "Unit cell." There are M rows and N columns of the memory cells 104 in the array, where M and N are integers. In some embodiments, M is an integer ranging from 1 to 512 and N is an integer ranging from 1 to 512. The N bit lines (BL and BLB) of the memory cells 104 are routed to multiplexer "Y_MUX" which are coupled to write drivers "Write-driver." The write drivers are coupled to a negative bias logic (NBL) circuit 506. The M word lines WL_1 through WL_M are routed to a word line decoder 504.

During a write operation, the NBL circuit 506 is configured to selectively adjust the voltage of the ground reference Vss. The NBL circuit 506 is a write-assist circuitry. The NBL circuit 506 comprises a negative voltage generator (e.g. coupling driver circuit 508) which is electrically connected to the bit lines BL and BLB of each cell of the plurality of SRAM cells in the memory cell array through a capacitor 505.

NBL circuit 506 is configured to receive an input signal (e.g., enable control signal) which triggers the negative voltage generator (e.g. coupling driver circuit 508) to selectively adjust the write driver ground reference voltage Vss. In some embodiments, during a write cycle of the memory macro 102, the bit line BL (or the bit line bar BLB) is discharged to a low voltage (Vss) state, and the bit line bar BLB (or the bit line BL) is pre-charged to a high voltage (Vdd) state, and the negative voltage generator is configured to reduce the bit line voltage lower than the low voltage state (e.g., Vss) (i.e., NVss is lower than Vss), if the negative voltage generator is enabled by the control signal. The ground source node NVss is coupled to either the bit-line or the bit-line bar through the multiplexers Y_MUX.

In some embodiments, during a write operation of a selected memory cell, the NBL circuit 506 is configured to connect the ground source node (NVss) of the write driver Write-driver to a negative voltage. In some embodiments, the negative voltage NVss is lower than a ground reference (Vss). In some embodiments, the negative voltage NVss is lower than the ground reference (Vss) by a first range. In some embodiments, the first range ranges from 50 millivolts (mV) to 300 mV.

In some embodiments, the ground source node (NVss) of the write driver Write-driver is electrically connected to a reset or zeroing circuit (not shown), which is configured to selectively reset the voltage of the ground source node (NVss). In some embodiments, the reset or zeroing circuit comprises an NMOS transistor, where the source is connected to ground, and the gate is connected to a reset signal, which switches the NMOS transistor on and off.

FIG. 10B illustrates more details about the Y_MUX and the write driver of FIG. 10A. FIG. 10B shows a unit memory cell 104 whose bit line and bit line bar are connected to the Y_MUX. The Y_MUX includes a Y decoder (or column decoder) (for selecting a memory cell's bit line and bit line bar) and two NMOS gates. The write driver circuit includes inverters whose outputs are coupled to the source (or drain) of the NMOS transistors in the Y_MUX.

FIG. 10B also shows a waveform diagram of various signals of the SRAM macro 102 including the word line, bit line, bit line bar, and the enable control signal to NBL circuit 506. As illustrated, in some embodiments, during a write operation, a high to low transition triggers the coupling driver circuit 508 to generate a rapid pulse to capacitor 505 and provides a negative delta voltage to Vss node, the voltage of the bit line bar BLB is coupled to a voltage that is lower than true ground (e.g., NVss), and the voltage of the bit line BL remains at a logically high level Vdd. In some embodiments, during a write operation, a high to low transition triggers the coupling driver circuit 508 to generate a rapid pulse to capacitor 505 and provides a negative delta voltage to Vss node, the voltage of the bit line BL is coupled to a voltage that is lower than true ground (e.g., NVss), and the voltage of the bit line bar BLB remains at a logically high level Vdd. Although FIG. 10B illustrates the bit line BL is pre-charged to high and the bit line bar BLB is discharged towards Vss, in some embodiments, the bit line bar BLB is pre-charged to high and the bit line BL is discharged towards Vss.

Figures 11A, 11B:
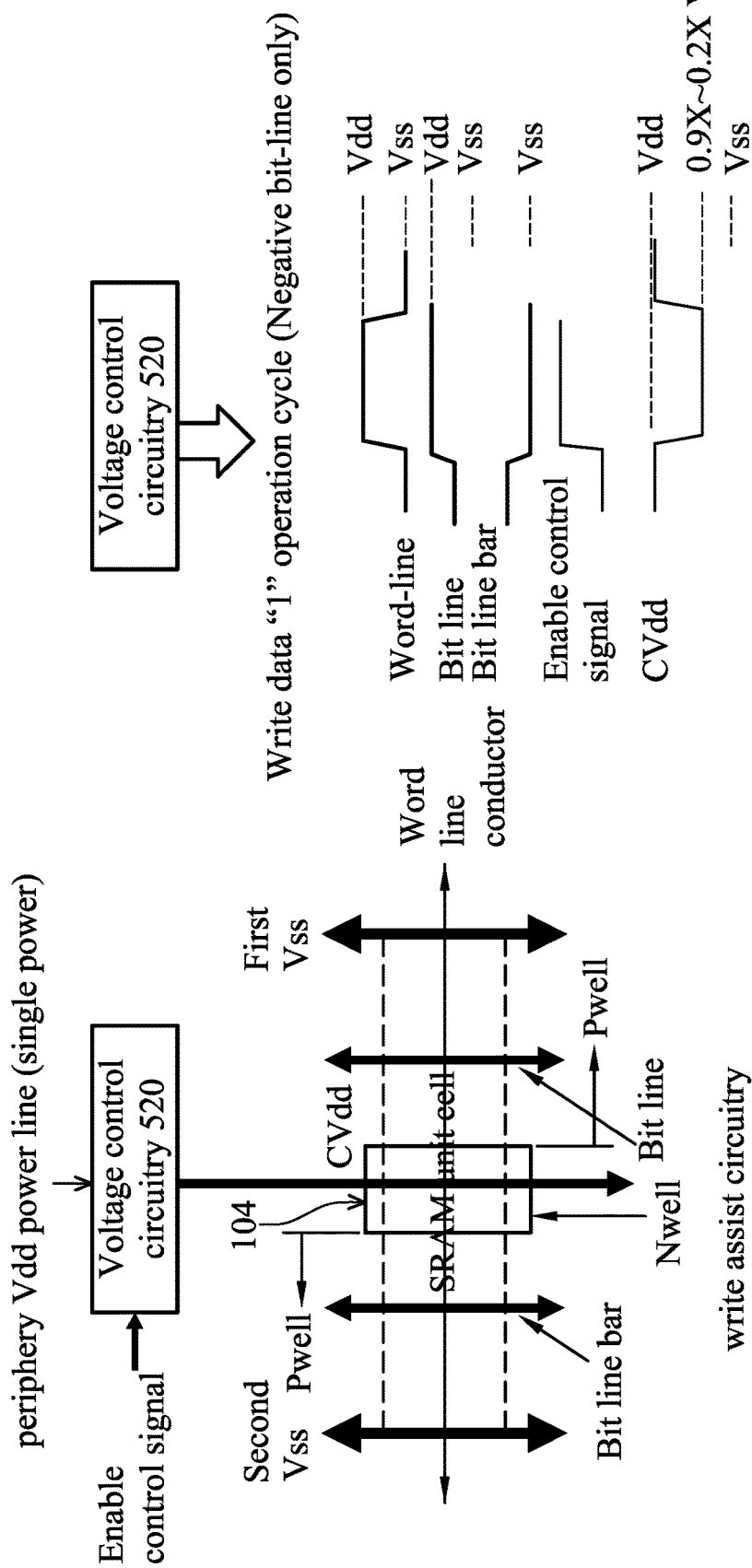
FIGS. 11A and 11B illustrate a write-assist circuit coupled to high-density memory cells such as those shown in FIG. 2, in accordance with another embodiment of the present disclosure.

FIGS. 11A and 11B illustrate another embodiment of the write-assist circuit implemented in the SRAM macro 102, particularly, in the peripheral logic circuit of the SRAM macro 102. FIG. 11A illustrates a unit memory cell 104 whose positive power supply CVdd is coupled to a voltage control circuitry 520. Voltage control circuit 520 is configured to receive an input signal (e.g., enable control signal) which triggers voltage control circuit 520 to selectively adjust the reference voltage CVdd provided to the unit memory cell 104. Referring to FIG. 11B, during a write operation of a selected memory cell 104, the voltage control circuit 520 is configured to reduce a voltage of the CVdd line of the selected memory cell 104 to a predetermined voltage, where the predetermined voltage ranges from 90% to 20% of Vdd. Although FIG. 11B illustrates the bit line BL is pre-charged to high and the bit line bar BLB is discharged to Vss, in some embodiments, the bit line bar BLB is pre-charged to high and the bit line BL is discharged to Vss.

Although not intended to be limiting, one or more embodiments of the present disclosure provide many benefits to a semiconductor device and the formation thereof. For example, embodiments of the present disclosure provide designs and layouts that use GAA devices to achieve both high-density memory and high-speed memory in the same IC. High-density GAA memory cells are provided with high beta ratio for improving noise margin during read operations and are coupled with write-assist circuitry to improve noise margin during write operations. High-speed GAA memory cells are provided with a beta ratio of 1.0 for read/write speed improvements, where their PD and PG GAA devices have substantially the same channel widths and gate lengths. With wide channels in the PD and PG GAA devices, the high-speed GAA memory cells do not need write-assist circuits. To increase current capability, the PD GAA devices in the high-speed memory cells are provided with wider transistor channels than the PD GAA devices in the high-density memory cells. Also, the bit lines (and/or other conductors) for the high-speed GAA memory cells are provided with greater widths than the counterparts for the high-density GAA memory cells to further increase the operating speed of the high-speed GAA memory cells. Because the high-density GAA memory cells use a high beta ratio and a narrow channel width (relative to the high-speed GAA memory cells), their areas are reduced, their power consumption (both active and standby power consumption) are reduced, and their Vcc_min is improved. Because the high-speed GAA memory cells use a beta ratio of 1 and a wide channel width (relative to the high-density GAA memory cells), their operation speed is improved and their write Vcc_min is also improved. The present embodiments can be readily integrated into existing CMOS fabrication processes.

In one example aspect, the present disclosure is directed to a semiconductor structure that includes a substrate and first and second SRAM cells over the substrate. The first SRAM cell includes a first inverter having a first pull-up GAA transistor coupled to a first pull-down GAA transistor and a second inverter having a second pull-up GAA transistor coupled to a second pull-down GAA transistor. The first and the second inverters are cross-coupled to form first data storage nodes. The first SRAM cell further includes first and second pass-gate GAA transistors for accessing the first data storage nodes. Each of the first and the second pass-gate GAA transistors has a first channel width. Each of the first and the second pull-down GAA transistors has a second channel width. A ratio of the second channel width to the first channel width is in a range of 1.05 to 1.5. The second SRAM cell includes a third inverter having a third pull-up GAA transistor coupled to a third pull-down GAA transistor and a fourth inverter having a fourth pull-up GAA transistor coupled to a fourth pull-down GAA transistor. The third and the fourth inverters are cross-coupled to form second data storage nodes. The second SRAM cell further includes third and fourth pass-gate GAA transistors for accessing the second data storage nodes. Each of the third and the fourth pass-gate GAA transistors has a third channel width. Each of the third and the fourth pull-down GAA transistors has a fourth channel width. The third and the fourth channel widths are substantially same. The fourth channel width is larger than the second channel width.

In an embodiment of the semiconductor structure, a ratio of the fourth channel width to the second channel width is in a range of 1.2 to 5. In another embodiment, the first SRAM cell occupies a first rectangular area and the second SRAM cell occupies a second rectangular area from a top view, a width of the first rectangular area is substantially same as a width of the second rectangular area, and a ratio of a length of the second rectangular area to a length of the first rectangular area is greater than or equal to 1.05. In a further embodiment, the ratio of the length of the second rectangular area to the length of the first rectangular area is in a range of 1.05 to 1.5. In another further embodiment, a ratio of the length of the first rectangular area to the width of the first rectangular area is greater than 2, and a ratio of the length of the second rectangular area to the width of the second rectangular area is greater than 2.5.

In an embodiment, each of the first and the second pass-gate GAA transistors has a first channel length, each of the first and the second pull-down GAA transistors has a second channel length, and the first channel length is substantially same as the second channel length.

In an embodiment, the first SRAM cell further includes a first bit line conductor and a first bit line bar conductor disposed in a first-level metal layer; the second SRAM cell further includes a second bit line conductor and a second bit line bar conductor disposed in the first-level metal layer; each of the first bit line conductor and the first bit line bar conductor has a first metal line width; each of the second bit line conductor and the second bit line bar conductor has a second metal line width; and a ratio of the second metal line width to the first metal line width is greater than 1.2.

In an embodiment, each of the first and the second pass-gate GAA transistors has a first channel thickness, a ratio of the first channel width to the first channel thickness is in a range of 0.9 to 4, each of the third and the fourth pass-gate GAA transistors has a third channel thickness, and a ratio of the third channel width to the third channel thickness is in a range of 3 to 10.

In an embodiment, the semiconductor structure further includes a write-assist circuit coupled to the first SRAM cell. In another embodiment, each of the first and the second pull-up GAA transistors has a fifth channel width, and each of the third and the fourth pull-up GAA transistors has a sixth channel width that is substantially equal to the fifth channel width.

In an embodiment, each of the first and the second pull-up GAA transistors has a fifth channel width, each of the third and the fourth pull-up GAA transistors has a sixth channel width, and a ratio of the sixth channel width to the fifth channel width is in a range of 1.05 to 1.5. In another embodiment, each of the third and the fourth pull-up GAA transistors has a sixth channel width, and a ratio of the third channel width to the sixth channel width is in a range of 1.5 to 5.

In another example aspect, the present disclosure is directed to a semiconductor structure that includes a substrate and first and second SRAM macros over the substrate. The first SRAM macro includes an array of first SRAM cells. Each of the first SRAM cells includes a first inverter having a first pull-up GAA transistor coupled to a first pull-down GAA transistor and a second inverter having a second pull-up GAA transistor coupled to a second pull-down GAA transistor. The first and the second inverters are cross-coupled to form first data storage nodes. Each of the first SRAM cells further includes first and second pass-gate GAA transistors for accessing the first data storage nodes. Each of the first and the second pass-gate GAA transistors has a first channel width, each of the first and the second pull-down GAA transistors has a second channel width, a ratio of the second channel width to the first channel width is in a range of 1.05 to 1.5, and each of the first and the second pull-up GAA transistors has a third channel width. The second SRAM macro includes an array of second SRAM cells. Each of the second SRAM cells includes a third inverter having a third pull-up GAA transistor coupled to a third pull-down GAA transistor and a fourth inverter having a fourth pull-up GAA transistor coupled to a fourth pull-down GAA transistor. The third and the fourth inverters are cross-coupled to form second data storage nodes. Each of the second SRAM cells further includes third and fourth pass-gate GAA transistors for accessing the second data storage nodes. Each of the third and the fourth pass-gate GAA transistors has a fourth channel width, each of the third and the fourth pull-down GAA transistors has a fifth channel width, and each of the third and the fourth pull-up GAA transistors has a sixth channel width. A ratio of the fifth channel width to the second channel width is in a range of 1.2 to 5. The first SRAM macro further includes an array of write-assist circuits that are coupled to the array of the first SRAM cells.

In an embodiment of the semiconductor structure, the fourth and the fifth channel widths are substantially same. In another embodiment, the array of the first SRAM cells has a first pitch along a first direction and a second pitch along a second direction, the array of the second SRAM cells has a third pitch along the first direction and a fourth pitch along the second direction, a ratio of the third pitch to the first pitch is in a range of 1.05 to 5, and the second pitch is substantially equal to the fourth pitch. In a further embodiment, a ratio of the first pitch to the second pitch is in a range of 2 to 2.5, and a ratio of the third pitch to the fourth pitch is in a range of 2.5 to 3.5.

In another embodiment, the first SRAM macro further includes first bit line conductors disposed in a first-level metal layer; the second SRAM macro further includes second bit line conductors disposed in the first-level metal layer; each of the first bit line conductors has a first metal line width; each of the second bit line conductors has a second metal line width; and a ratio of the second metal line width to the first metal line width is in a range of 1.2 to 2.

In yet another example aspect, the present disclosure is directed to a semiconductor structure that includes a substrate and first and second SRAM macros over the substrate. The first SRAM macro includes an array of first SRAM cells. Each of the first SRAM cells includes a first inverter having a first pull-up GAA transistor coupled to a first pull-down GAA transistor and a second inverter having a second pull-up GAA transistor coupled to a second pull-down GAA transistor. The first and the second inverters are cross-coupled to form first data storage nodes. Each of the first SRAM cells further includes first and second pass-gate GAA transistors for accessing the first data storage nodes. Each of the first and the second pass-gate GAA transistors has a first channel width, each of the first and the second pull-down GAA transistors has a second channel width, a ratio of the second channel width to the first channel width is in a range of 1.05 to 1.5, and each of the first and the second pull-up GAA transistors has a third channel width. The second SRAM macro includes an array of second SRAM cells. Each of the second SRAM cells includes a third inverter having a third pull-up GAA transistor coupled to a third pull-down GAA transistor and a fourth inverter having a fourth pull-up GAA transistor coupled to a fourth pull-down GAA transistor. The third and the fourth inverters are cross-coupled to form second data storage nodes. Each of the second SRAM cells further includes third and fourth pass-gate GAA transistors for accessing the second data storage nodes. Each of the third and the fourth pass-gate GAA transistors has a fourth channel width. Each of the third and the fourth pull-down GAA transistors has a fifth channel width. Each of the third and the fourth pull-up GAA transistors has a sixth channel width. A ratio of the fifth channel width to the second channel width is in a range of 1.2 to 5. The first SRAM macro further includes first bit line conductors disposed in a first-level metal layer. The second SRAM macro further includes second bit line conductors disposed in the first-level metal layer. Each of the first bit line conductors has a first metal line width. Each of the second bit line conductors has a second metal line width. A ratio of the second metal line width to the first metal line width is greater than 1.2.

In an embodiment of the semiconductor structure, the fourth and the fifth channel widths are substantially same. In another embodiment, the array of the first SRAM cells has a first pitch along a first direction and a second pitch along a second direction, the array of the second SRAM cells has a third pitch along the first direction and a fourth pitch along the second direction, a ratio of the third pitch to the first pitch is in a range of 1.05 to 5, the second pitch is substantially equal to the fourth pitch, a ratio of the first pitch to the second pitch is in a range of 2 to 2.5, and a ratio of the third pitch to the fourth pitch is in a range of 2.5 to 3.5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate; and
first and second SRAM cells over the substrate,
wherein the first SRAM cell includes a first inverter having a first pull-up GAA transistor coupled to a first pull-down GAA transistor and a second inverter having a second pull-up GAA transistor coupled to a second pull-down GAA transistor, the first and the second inverters are cross-coupled to form a first data storage nodes, the first SRAM cell further includes first and second pass-gate GAA transistors for accessing the first data storage nodes, each of the first and the second pass-gate GAA transistors has a first channel width, each of the first and the second pull-down GAA transistors has a second channel width, and a ratio of the second channel width to the first channel width is in a range of 1.05 to 1.5,
wherein the second SRAM cell includes a third inverter having a third pull-up GAA transistor coupled to a third pull-down GAA transistor and a fourth inverter having a fourth pull-up GAA transistor coupled to a fourth pull-down GAA transistor, the third and the fourth inverters are cross-coupled to form a second data storage nodes, the second SRAM cell further includes third and fourth pass-gate GAA transistors for accessing the second data storage nodes, each of the third and the fourth pass-gate GAA transistors has a third channel width, each of the third and the fourth pull-down GAA transistors has a fourth channel width, and the third and the fourth channel widths are substantially same, and
wherein the fourth channel width is larger than the second channel width, and
wherein each of the first and the second pull-up GAA transistors has a fifth channel width, each of the third and the fourth pull-up GAA transistors has a sixth channel width, and a ratio of the sixth channel width to the fifth channel width is in a range of 1.05 to 1.5.

2. The semiconductor structure of claim 1, wherein a ratio of the fourth channel width to the second channel width is in a range of 1.2 to 5.

3. The semiconductor structure of claim 1, wherein the first SRAM cell occupies a first rectangular area, and the second SRAM cell occupies a second rectangular area from a top view, a width of the first rectangular area is substantially same as a width of the second rectangular area, and a ratio of a length of the second rectangular area to a length of the first rectangular area is greater than or equal to 1.05.

4. The semiconductor structure of claim 3, wherein the ratio of the length of the second rectangular area to the length of the first rectangular area is in a range of 1.05 to 1.5.

5. The semiconductor structure of claim 3, wherein a ratio of the length of the first rectangular area to the width of the first rectangular area is greater than 2, and a ratio of the length of the second rectangular area to the width of the second rectangular area is greater than 2.5.

6. The semiconductor structure of claim 1, wherein each of the first and the second pass-gate GAA transistors has a first channel length, each of the first and the second pull-down GAA transistors has a second channel length, and the first channel length is substantially same as the second channel length.

7. The semiconductor structure of claim 1, wherein the first SRAM cell further includes a first bit line conductor and a first bit line bar conductor disposed in a first-level metal layer; the second SRAM cell further includes a second bit line conductor and a second bit line bar conductor disposed in the first-level metal layer; each of the first bit line conductor and the first bit line bar conductor has a first metal line width; each of the second bit line conductor and the second bit line bar conductor has a second metal line width; and a ratio of the second metal line width to the first metal line width is greater than 1.2.

8. The semiconductor structure of claim 1, wherein each of the first and the second pass-gate GAA transistors has a first channel thickness, a ratio of the first channel width to the first channel thickness is in a range of 0.9 to 4, each of the third and the fourth pass-gate GAA transistors has a third channel thickness, and a ratio of the third channel width to the third channel thickness is in a range of 3 to 10.

9. The semiconductor structure of claim 1, further comprising a write-assist circuit coupled to the first SRAM cell.

10. The semiconductor structure of claim 1, wherein each of the first and the second pull-up GAA transistors has a fifth channel width, and each of the third and the fourth pull-up GAA transistors has a sixth channel width that is substantially equal to the fifth channel width.

11. The semiconductor structure of claim 1, wherein each of the third and the fourth pull-up GAA transistors has a sixth channel width, and a ratio of the third channel width to the sixth channel width is in a range of 1.5 to 5.

12. The semiconductor structure of claim 1,
wherein the first pull-up GAA transistor and the second pull-up GAA transistor are of p-type,
wherein the first pull-down GAA transistor and the second pull-down GAA transistor are of n-type.

13. A semiconductor structure, comprising:
a substrate; and
first and second SRAM macros over the substrate,
wherein the first SRAM macro includes an array of first SRAM cells, each of the first SRAM cells includes a first inverter having a first pull-up GAA transistor coupled to a first pull-down GAA transistor and a second inverter having a second pull-up GAA transistor coupled to a second pull-down GAA transistor, the first and the second inverters are cross-coupled to form a first data storage nodes, each of the first SRAM cells further includes first and second pass-gate GAA transistors for accessing the first data storage nodes, each of the first and the second pass-gate GAA transistors has a first channel width, each of the first and the second pull-down GAA transistors has a second channel width, a ratio of the second channel width to the first channel width is in a range of 1.05 to 1.5, and each of the first and the second pull-up GAA transistors has a third channel width, wherein the second SRAM macro includes an array of second SRAM cells, each of the second SRAM cells includes a third inverter having a third pull-up GAA transistor coupled to a third pull-down GAA transistor and a fourth inverter having a fourth pull-up GAA transistor coupled to a fourth pull-down GAA transistor, the third and the fourth inverters are cross-coupled to form a second data storage nodes, each of the second SRAM cells further includes third and fourth pass-gate GAA transistors for accessing the second data storage nodes, each of the third and the fourth pass-gate GAA transistors has a fourth channel width, each of the third and the fourth pull-down GAA transistors has a fifth channel width, and each of the third and the fourth pull-up GAA transistors has a sixth channel width, wherein a ratio of the fifth channel width to the second channel width is in a range of 1.2 to 5, and a ratio of the sixth channel width to the third channel width is in a range of 1.05 to 1.5 and, wherein the first SRAM macro further includes an array of write-assist circuits that are coupled to the array of the first SRAM cells.

14. The semiconductor structure of claim 13, wherein the fourth and the fifth channel widths are substantially same.

15. The semiconductor structure of claim 13, wherein the array of the first SRAM cells has a first pitch along a first direction and a second pitch along a second direction, the array of the second SRAM cells has a third pitch along the first direction and a fourth pitch along the second direction, a ratio of the third pitch to the first pitch is in a range of 1.05 to 5, and the second pitch is substantially equal to the fourth pitch.

16. The semiconductor structure of claim 15, wherein a ratio of the first pitch to the second pitch is in a range of 2 to 2.5, and a ratio of the third pitch to the fourth pitch is in a range of 2.5 to 3.5.

17. The semiconductor structure of claim 13, wherein the first SRAM macro further includes first bit line conductors disposed in a first-level metal layer; the second SRAM macro further includes second bit line conductors disposed in the first-level metal layer; each of the first bit line conductors has a first metal line width; each of the second bit line conductors has a second metal line width; and a ratio of the second metal line width to the first metal line width is in a range of 1.2 to 2.

18. A semiconductor structure, comprising:
a substrate; and
first and second SRAM macros over the substrate, wherein the first SRAM macro includes an array of first SRAM cells, each of the first SRAM cells includes a first inverter having a first pull-up GAA transistor coupled to a first pull-down GAA transistor and a second inverter having a second pull-up GAA transistor coupled to a second pull-down GAA transistor, the first and the second inverters are cross-coupled to form a first data storage nodes, each of the first SRAM cells further includes first and second pass-gate GAA transistors for accessing the first data storage nodes, each of the first and the second pass-gate GAA transistors has a first channel width, each of the first and the second pull-down GAA transistors has a second channel width, a ratio of the second channel width to the first channel width is in a range of 1.05 to 1.5, and each of the first and the second pull-up GAA transistors has a third channel width, wherein the second SRAM macro includes an array of second SRAM cells, each of the second SRAM cells includes a third inverter having a third pull-up GAA transistor coupled to a third pull-down GAA transistor and a fourth inverter having a fourth pull-up GAA transistor coupled to a fourth pull-down GAA transistor, the third and the fourth inverters are cross-coupled to form a second data storage nodes, each of the second SRAM cells further includes third and fourth pass-gate GAA transistors for accessing the second data storage nodes, each of the third and the fourth pass-gate GAA transistors has a fourth channel width, each of the third and the fourth pull-down GAA transistors has a fifth channel width, and each of the third and the fourth pull-up GAA transistors has a sixth channel width, wherein a ratio of the fifth channel width to the second channel width is in a range of 1.2 to 5, and a ratio of the sixth channel width to the third channel width is in a range of 1.05 to 1.5 and, wherein the first SRAM macro further includes first bit line conductors disposed in a first-level metal layer, the second SRAM macro further includes second bit line conductors disposed in the first-level metal layer, each of the first bit line conductors has a first metal line width, each of the second bit line conductors has a second metal line width, and a ratio of the second metal line width to the first metal line width is greater than 1.2.

19. The semiconductor structure of claim 18, wherein the fourth and the fifth channel widths are substantially same.

20. The semiconductor structure of claim 18, wherein the array of the first SRAM cells has a first pitch along a first direction and a second pitch along a second direction, the array of the second SRAM cells has a third pitch along the first direction and a fourth pitch along the second direction, a ratio of the third pitch to the first pitch is in a range of 1.05 to 5, the second pitch is substantially equal to the fourth pitch, a ratio of the first pitch to the second pitch is in a range of 2 to 2.5, and a ratio of the third pitch to the fourth pitch is in a range of 2.5 to 3.5.

* * * * *